United States Patent [19]
Chu

[11] Patent Number: 4,962,303
[45] Date of Patent: Oct. 9, 1990

[54] INFRARED IMAGE DETECTOR UTILIZING SCHOTTKY BARRIER JUNCTIONS

[75] Inventor: Tak-Kin Chu, Bethesda, Md.

[73] Assignee: The United States of America as represented by the Secretary of the Navy, Washington, D.C.

[21] Appl. No.: 371,884

[22] Filed: Jun. 27, 1989

[51] Int. Cl.⁵ .................. H01J 40/14; G01J 5/20; H01L 27/14
[52] U.S. Cl. .................. 250/208.1; 250/211 J; 250/338.4; 357/30
[58] Field of Search .......... 250/332, 338.4, 578, 250/211 J, 226, 208.1; 357/30 H, 30 L, 30 Q, 30 R, 30 C

[56] References Cited

U.S. PATENT DOCUMENTS

| | | | |
|---|---|---|---|
| 3,716,424 | 2/1973 | Schoolar | 148/175 |
| 3,761,718 | 9/1973 | Kohn et al. | 250/211 |
| 3,979,604 | 9/1976 | Bate | 250/211 J |
| 3,989,946 | 11/1976 | Chapman et al. | 250/338.4 |
| 4,131,793 | 12/1978 | Stoutmeyer et al. | 250/211 |
| 4,231,053 | 10/1980 | Schoolar | 357/30 |
| 4,369,372 | 1/1983 | Yoshioka et al. | 250/578 |
| 4,406,050 | 9/1983 | Chu et al. | 29/572 |
| 4,595,795 | 6/1986 | Basol | 357/30 Q |
| 4,603,258 | 7/1986 | Sher et al. | 250/338.4 |
| 4,758,734 | 7/1988 | Uchida et al. | 250/578 |
| 4,786,819 | 11/1988 | Tei | 250/578 |
| 4,826,777 | 5/1989 | Ondris | 357/30 H |
| 4,849,029 | 7/1989 | Delahoy | 357/30 Q |
| 4,855,802 | 8/1989 | Kato | 250/578 |

Primary Examiner—David C. Nelms
Assistant Examiner—Michael Messinger
Attorney, Agent, or Firm—John D. Lewis; Kenneth E. Walden

[57] ABSTRACT

An infrared image detector array is constructed by depositing a plurality of non-contiguous strips of infrared radiation responsive, semiconductor material on one side of a base substrate. A contiguous metal semiconductor contact in then overlaid on the plurality of strips thereby forming an individual Schottky barrier detector element wherever the metal contact crosses one of the plurality of strips.

14 Claims, 3 Drawing Sheets

INFRARED IMAGE DETECTOR UTILIZING SCHOTTKY BARRIER JUNCTIONS

ORIGIN OF THE INVENTION

The invention described herein was made in the performance of official duties by an employee of the Department of the Navy and may be manufactured, used, licensed by or for the Government for any governmental purpose without payment of any royalties thereon.

BACKGROUND OF THE INVENTION

This invention relates to photo-detectors and more particularly to an infrared image detector.

It is well established in the infrared photodetector field that an infrared detector can be built utilizing epitaxial lead salt thin film technology. Single crystal semiconductor films of lead chalcogenides can be epitaxially grown on heated alkali halide and alkaline earth halide substrates by vacuum evaporation. The lead chalcogenides used include the sulfides, selenides, tellurides and mixtures thereof. The substrates are single crystals of infrared transparent alkali halides and alkaline earth halides. Examples include barium fluoride, strontium fluoride, calcium fluoride, lithium fluoride, sodium chloride, potassium chloride, etc. Next, a metal semiconductor contact such as lead or indium is deposited on the surface of an epitaxial layer of the lead chalcogenide thereby creating a non-ohmic Schottky barrier at the point of contact resulting in an infrared sensitive diode. A detailed description of infrared sensitive diode concepts, suitable materials and methods of fabrication are disclosed more fully in U.S. Pat. No. 4,406,050, entitled "Method for Fabricating Lead Halide Sensitized Infrared Photodiodes", which was issued to the present inventor on Sept. 27, 1983, and is herein incorporated by reference.

It is also well established in the prior art that a multi-color, self-filtering detector can be built by depositing successive epilayers of lead chalcogenide on the base substrate. Each layer is normal to the surface of the substrate and contiguous in directions parallel to the surface of the substrate. Each layer is photoresponsive to infrared radiation based upon its chemical composition and is also a photon filter for the succeeding layers, i.e. each layer is used as a detection layer and as a filter layer. The response yielded by the detection portion of each layer is measured as a voltage versus the frequency of an infrared wave band. The wave band of each layer yielding a measurable voltage is determined by the chemical composition of the layer. Thus, the resulting infrared detector can be built to receive radiation in predetermined wave bands. Typical and illustrative of this technology is U.S. Pat. No. 4,323,911 which was issued to Campbell.

In FIG. 1, there is shown a cross-sectional view of a prior art infrared detector having N detector elements. A first semiconductor layer made of N separate materials 11A, 11B, ... 11N and a second semiconductor layer made of N separate materials 12A,12B...,12N is deposited on a base substrate 10. Layer 12 forms a detection layer made of N distinct materials defining N optical areas. Each optical area has different optical and radiation absorption properties due to differences in chemical composition. Each optical area will therefore respond to infrared radiation over a different wave band of the infrared spectrum. Accordingly, optical area 12A is fitted with a semiconductor metal contact 13A and a lead wire 14A. Metal contact 13A is a non-ohmic contact. Each adjacent contiguous detection layer 12B, ...,12N is similarly fitted with non-ohmic contacts 13B, ...,13N and lead wires 14B, ...,14N. Each optical area must also be equipped with an ohmic contact or ground wire 15A,15B ...,15N which is in turn attached to an appropriate lead wire 16A,16B ...,16N.

The aforementioned construction of prior art infrared image detectors poses several technical disadvantages. First, the surface of detection layer 12 must be insulated against short circuits when electrical connections are made to the metal contacts 13A,13B ...,13N thereby adding complexity and cost to the fabrication process. Second, the detection layer 12 is optically and electrically active in the areas 17 not covered by the metal contacts thereby causing optical cross-talk between detector elements.

SUMMARY OF THE INVENTION

Accordingly, it is an object of the present invention to provide an infrared image detector array using epitaxial lead salt film technology that minimizes optical cross-talk between detector elements in the array.

Another object of the present invention is to provide an infrared image detector array having simple and efficient electrical connection points.

A still further object of the present invention is to provide an infrared image detector array having low fabrication costs.

Other objects and advantages of this invention will become more apparent hereinafter in the specifications and drawings.

In accordance with the invention, a plurality of non-contiguous strips of infrared light responsive semiconductor material are deposited on an infrared light transparent substrate. A contiguous metal semiconductor contact is then overlaid on the semiconductor strips. An infrared detector element is formed wherever the metal semiconductor contact crosses one of the semiconductor strips. The metal contact serves as the ohmic connection point for all of the formed detector elements while each of the semiconductor strips serve as a non-ohmic Schottky barrier connection point.

DETAILED DESCRIPTION OF THE PREFERRED EMBODIMENTS

Figure 1:
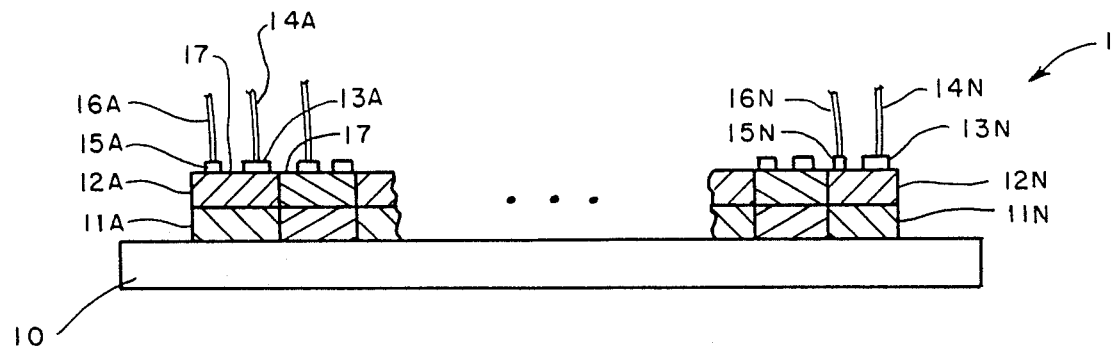
FIG. 1 is a cross-sectional view of a multi-layer detector illustrating the prior art.
Figure 2:
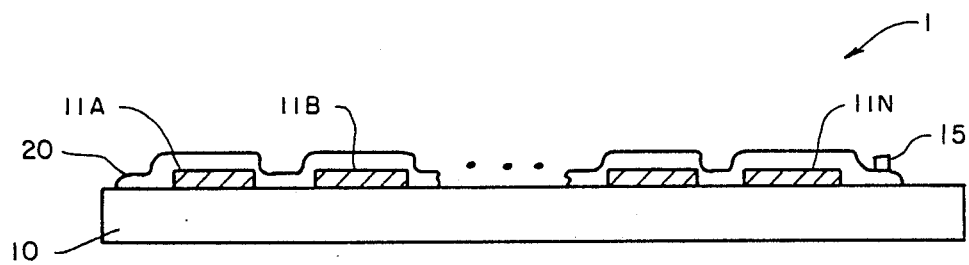
FIG. 2 is a cross-sectional view of the infrared detector array in a preferred embodiment of the present invention.

Referring now to the drawings and in particular to FIG. 2, there is shown a cross-sectional view of the infrared image detector array 1 according to the present invention. A series of non-contiguous parallel strips 11A, . . . ,11N of semiconductor material are epitaxially grown by vapor deposition onto an infrared transparent base substrate 10. Base substrate 10 is preferably single crystals of alkali halides and alkali earth halides. Parallel strips 11A, . . . ,11N are semiconductor materials that are optically responsive to infrared radiation. The strips are typically formed from lead chalcogenides and include the sulfides, selenides, tellurides and mixtures thereof. Alternatively, the strips may be formed from alloys such as lead chalcogenides and tin chalcogenides or lead chalcogenides and cadmium chalcogenides. The dimensions of the strips are limited only by the dimensions of the substrate 10 and the resolution of the fabrication technique. The strips may be any shape as long as they are non-contiguous. Typically, a strip is 0.002 inches wide, 0.3 inches long, 1 to 10 micrometers thick and is separated from an adjacent strip by 0.002 inches.

A contiguous metal semiconductor contact strip 20 is vapor deposited on the semiconductor strips 11A, . . . ,11N and on the substrate 10. Contiguous strip 20 may be any metal semiconductor material such as lead or indium. As can be seen from a top view of the present invention shown in FIG. 3, the contiguous metal contact strip 20 crosses the parallel strips 11A, . . . ,11N in a perpendicular fashion thereby forming active detector element areas 21A, . . . ,21N. However, contiguous metal contact strip 20 may alternatively cross the parallel strips 11A, . . . ,11N at an angle other than 90° as shown in FIG. 4. Electric contacts 13A, . . . ,13N deposited on the parallel strips 11A, . . . ,11N serve as the non-ohmic Schottky barrier contacts for connection to an electrical voltage measuring device. A single contact 15 is deposited at one point on the metal contact strip 20 and serves as the ohmic or ground contact for all of the detector elements 21A, . . . ,21N.

Figure 5:
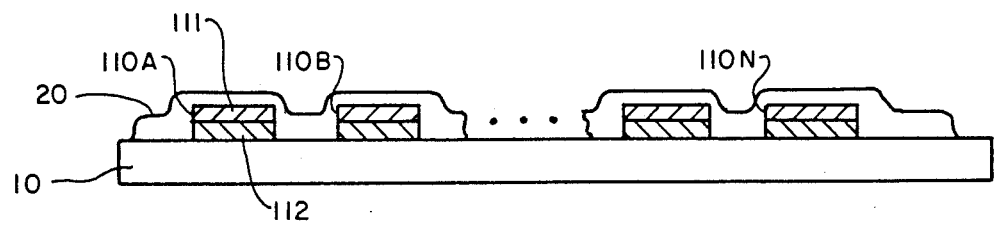
FIG. 5 is a cross-sectional view of a multi-layer detector array according to the present invention.

A multi-color response may be achieved by utilizing materials of varied composition for each of the strips 11A, . . . ,11N that are responsive to distinct wavelengths in the electromagnetic spectrum. Alternatively, a multi-color, self-filtering detector detector array may be constructed by depositing multi-layer strips 110A, . . . ,110N as shown in FIG. 5. In this case, semiconductor layer 111 will serve as an optical filter for semiconductor layer 112 which serves as the detection layer.

Figure 3:
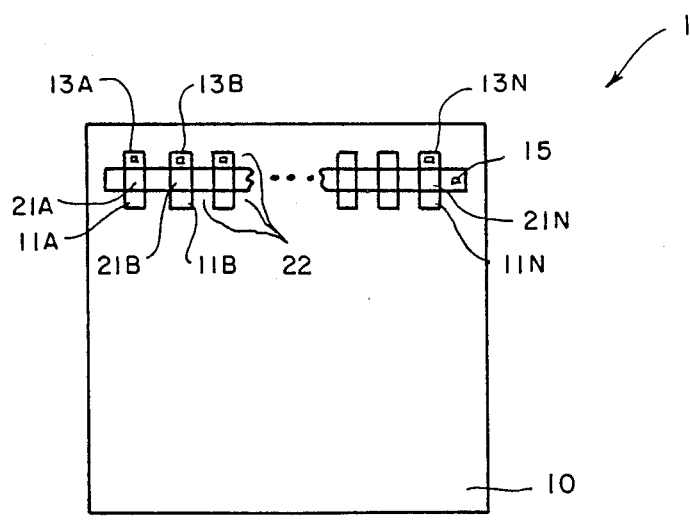
FIG. 3 is a top view of the infrared detector array of the present invention.
Figure 4:
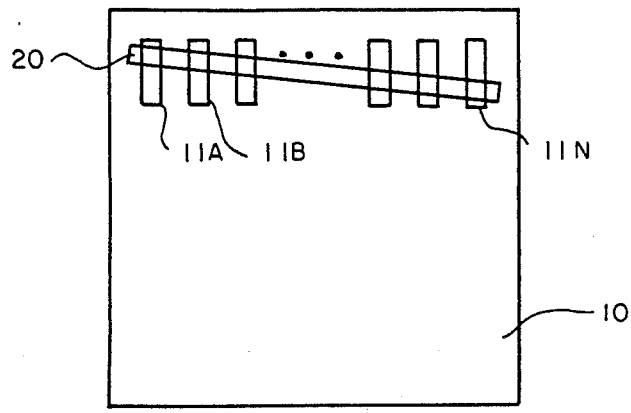
FIG. 4 is a top view of an alternative embodiment of the infrared detector array.
Figure 6:
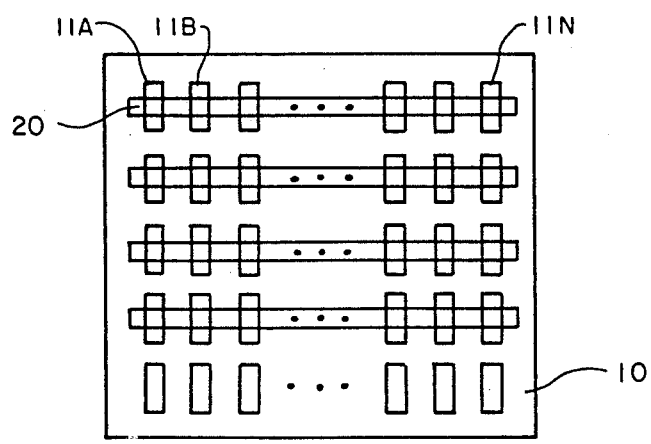
FIG. 6 is a top view of a two dimensional detector array according to the present invention.
Figure 7:
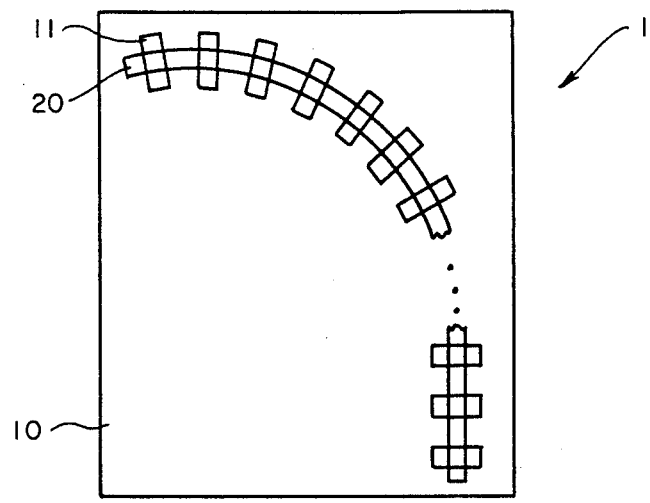
FIG. 7 is a top view of an alternative detector array pattern.

The examples of the present invention shown in FIG. 2, 3 and 4 are for a linear diode array. Two dimensional detector arrays may be constructed by merely repeating the linear diode pattern over the entire area of the substrate 10 as shown in FIG. 6. Alternatively, the strips 11A, . . . ,11N need not be parallel but may be deposited on the base substrate 10 in any non-contiguous pattern as shown in FIG. 7.

Figure 8:
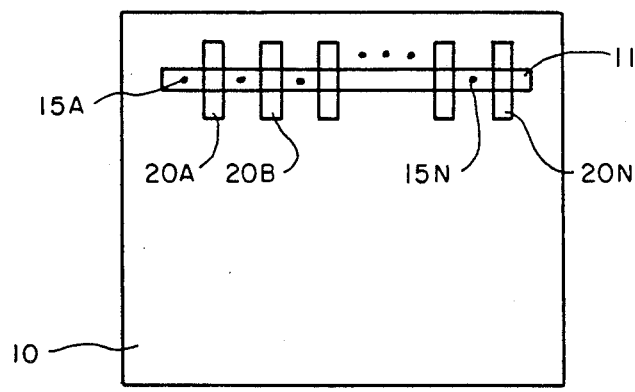
FIG. 8 is a top view of an alternative detector array construction.

In yet another embodiment of the present invention, semiconductor strips 11A, . . . ,11N and contiguous metal contact 20 may be interchanged in the construction of the detector array. In FIG. 8 a long strip of semiconductor material 11 is first deposited on the substrate 10. Metal strips 20A, . . . ,20N are then deposited on the strip 11 and substrate 10. Detector elements are formed at the crossings of the semiconductor strip 11 with the metal strips 20A, . . . ,20N. Since semiconductor strip 11 is less conductive than metal, a higher series resistance is introduced into each of the detector circuits if the ohmic contact is far from the detector element. Therefore, multiple ohmic contacts 15A, . . . ,15N must be made on the semiconductor strip 11 next to, and in the spaces between, metal strips 20A, . . . ,20N. It should be noted that this configuration may be less desirable due to the added complexity of fabrication.

In prior art detectors, cross-talk between detector elements resulted from the migration of charge carriers from one element to an adjacent element since the semiconductor material covered the entire area of the substrate. However, by depositing the infrared responsive semiconductor material as non-contiguous strips, the physical separation of the strips prevents the migration of charge carriers thereby reducing crosstalk between detector elements. Thus, any response generated at an individual detector element, such as 21A shown in FIG. 3, cannot interfere with the response generated at adjacent detector elements.

A further advantage of the present invention lies in the fact that an individual detector element is formed at the crossing of a semiconductor strip 11A and metal contact strip 20. Accordingly, a detector element 21A is not surrounded by radiation absorbing semiconductor material on all sides as in the prior art. Prior art detector elements were subject to error due to a blurred optical image created when radiation was absorbed by the semiconductor material adjacent and contiguous to a detector element. However, since the present invention utilizes non-contiguous semiconductor strips, detector element 21A is surrounded by radiation absorbing semiconductor material on only two sides. Thus, radiation falling on areas 22 not covered by the semiconductor strips passes through the infrared transparent base substrate 10 and is not absorbed. The blurred optical image error of the present invention is thereby reduced by a factor of approximately two over the prior art. Furthermore, substrate areas 22 not covered by the semiconductor strips are also available for other purposes, such as electric connections that are less susceptible to short circuits than prior art connections.

Finally, because the material used in the fabrication of the substrate 10 is usually transparent to visible light, illumination of the substrate 10 should facilitate the use of mask alignment in the deposition of the semiconductor materials and metal contacts. This should reduce the labor cost in the fabrication of the detector arrays.

Thus, although the invention has been described relative to specific embodiments thereof, it is not so limited and numerous variations and modifications thereof will be readily apparent to those skilled in the art in light of the above teaching. It is therefore to be understood that within the scope of the appended claims the invention maybe practiced otherwise than as specifically described.

What is claimed is:

1. An infrared image detector comprising:
   (a) an infrared light transparent substrate;
   (b) a plurality of optically responsive materials deposited in a non-contiguous plane on one side of said substrate; and
   (c) at least one contiguous metal semiconductor contact deposited on said one side of said substrate and on a portion of said plurality of optically responsive materials wherein an infrared detector element is formed wherever said metal contact crosses one of said plurality of optically responsive materials and wherein said metal contact is a single ohmic connection point for each of said formed detector elements and each of said plurality of optically responsive materials crossed by said contiguous metal contact is a non-ohmic, Schottky barrier connection point.

2. An infrared image detector as in claim 1 wherein said plurality of optically responsive materials comprise semiconductor materials optically responsive to infrared radiation.

3. An infrared image detector as in claim 2, each of said semiconductor materials comprising a material having a distinct chemical composition wherein said formed detector elements respond to wave bands of infrared radiation based upon said chemical composition.

4. An infrared image detector as in claim 2 wherein said semiconductor materials are selected from the group of consisting of lead chalcogenides, alloys of lead chalcogenides with tin chalcogenides, and alloys of lead chalcogenides with cadmium chalcogenides.

5. An infrared image detector as in claim 1 wherein said plurality of optically responsive materials comprises parallel strips of optically responsive materials.

6. An infrared image detector as in claim 5 wherein each of said strips comprise a single layer optically responsive material.

7. An infrared image detector as in claim 5 wherein at least one of said strips comprises multi-layers of optically responsive material.

8. An infrared image detector as in claim 5 wherein said contiguous metal contact is perpendicular to said parallel strips.

9. An infrared image detector as in claim 5 wherein said contiguous metal contact is at an acute angle to said parallel strips.

10. An infrared image detector as in claim 1 wherein said substrate comprises an infrared transparent single crystal material selected from the group consisting of alkalihalides and alkaline earth halides.

11. An infrared image detector as in claim 1 wherein said contiguous metal contact is lead.

12. An infrared image detector comprising:
(a) an infrared light transparent substrate;
(b) a plurality of non-contiguous strips of semiconductor materials deposited on one side of said substrate wherein said strips are optically responsive to infrared radiation;
(c) at least one contiguous metal semiconductor contact deposited on said one side of said substrate and on a portion of at least one of said strips wherein an infrared detector element is formed wherever said metal contact crosses one of said strips and wherein said metal contact is a single ohmic connection point for each of said formed detector elements and each of said strips crossed by said metal contact is a non-ohmic, Schottky barrier connection point.

13. An infrared image detector as in claim 12 wherein said non-contiguous strips are parallel.

14. A multicolored infrared image detector comprising:
(a) an infrared light transparent substrate;
(b) a plurality of optically responsive materials of differing composition deposited in a non-contiguous plane on one side of said substrate whereby the detector is responsive to distinct wavelengths correlated with each of said plurality of optically responsive materials deposited on said substrate; and
(c) at least one contiguous metal semiconductor contact deposited on said substrate and on a portion of said plurality of optically responsive materials wherein an infrared detector element is formed wherever said metal contact crosses one of said plurality of optically responsive materials and wherein said metal contact is a single ohmic connection point for each of said formed detector elements and each of said plurality of optically responsive materials crossed by said contiguous metal contact is a non-ohmic, Schottky barrier connection point.

* * * * *